United States Patent
Tang et al.

(10) Patent No.: US 12,148,556 B2
(45) Date of Patent: Nov. 19, 2024

(54) INTEGRATED MAGNETIC ASSEMBLY

(71) Applicant: Texas Instruments Incorporated, Dallas, TX (US)

(72) Inventors: Yiqi Tang, Allen, TX (US); Rajen Manicon Murugan, Dallas, TX (US); Jonathan Almeria Noquil, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 440 days.

(21) Appl. No.: 17/383,878

(22) Filed: Jul. 23, 2021

(65) Prior Publication Data
US 2022/0028593 A1   Jan. 27, 2022

Related U.S. Application Data
(60) Provisional application No. 63/056,344, filed on Jul. 24, 2020.

(51) Int. Cl.
*H01L 23/498* (2006.01)
*H01F 17/00* (2006.01)
(Continued)

(52) U.S. Cl.
CPC ..... *H01F 17/0006* (2013.01); *H01F 27/2804* (2013.01); *H01F 41/041* (2013.01);
(Continued)

(58) Field of Classification Search
CPC ................. H01L 23/5227; H01L 28/10; H01L 2924/1206; H01L 23/538; H01L 23/5383; H01L 23/5386; H01L 23/49822
See application file for complete search history.

(56) References Cited

U.S. PATENT DOCUMENTS 7,791,900 B2   9/2010   Fouquet et al.
9,035,422 B2   5/2015   Khanolkar et al.
(Continued)

FOREIGN PATENT DOCUMENTS

CN   209056362 U   7/2019
CN   209882281 U   12/2019
WO   2010137090 A1   12/2010

OTHER PUBLICATIONS

PCT International Search Report Intl App No. PCT/US 2021/043157 mailed Oct. 28, 2021, 3 pgs.
(Continued)

*Primary Examiner* — Tucker J Wright
(74) *Attorney, Agent, or Firm* — Ronald O. Neerings; Frank D. Cimino

(57) ABSTRACT

An electronic device includes a multilevel package substrate, conductive leads, a die, and a package structure. The multilevel package substrate has a first level, a second level, and a third level, each having patterned conductive features and molded dielectric features. The first level includes a first patterned conductive feature with multiple turns that form a first winding. The second level includes a second patterned conductive feature, and the third level includes a third patterned conductive feature with multiple turns that form a second winding. A first terminal of the die is coupled to the first end of the first winding, a second terminal of the die is coupled to the second end of the first winding, and a third terminal of the die is coupled to a first conductive lead. The package structure encloses the first die, the second die, and a portion of the multilevel package substrate.

16 Claims, 17 Drawing Sheets

(51) Int. Cl.
     *H01F 27/28*     (2006.01)
     *H01F 41/04*     (2006.01)
     *H01L 21/56*     (2006.01)
     *H01L 23/495*    (2006.01)
     *H01L 23/522*    (2006.01)
     *H05K 1/16*      (2006.01)

(52) U.S. Cl.
     CPC ........ *H01L 21/56* (2013.01); *H01L 23/49503* (2013.01); *H01L 23/49822* (2013.01); *H01L 23/5227* (2013.01); *H05K 1/165* (2013.01)

(56) References Cited

U.S. PATENT DOCUMENTS

| | | | |
|---|---|---|---|
| 2009/0153283 A1 | 6/2009 | Fouquet et al. | |
| 2015/0069572 A1* | 3/2015 | Khanolkar | H01L 28/10 257/531 |
| 2017/0110403 A1* | 4/2017 | Hwang | H01L 21/4814 |
| 2020/0066716 A1 | 2/2020 | Tang et al. | |
| 2020/0211961 A1 | 7/2020 | Khanolkar | |
| 2021/0175326 A1 | 6/2021 | Romig et al. | |

OTHER PUBLICATIONS

European Patent Office Search Report, Application No. 21845866.9-1212/4186081, mailed Dec. 21, 2003, 3 pages.

* cited by examiner

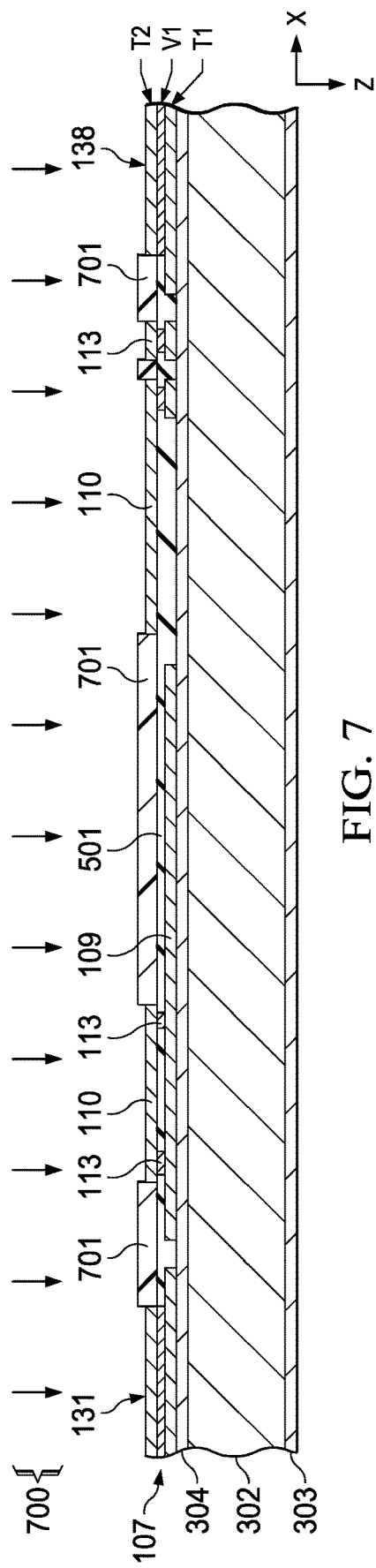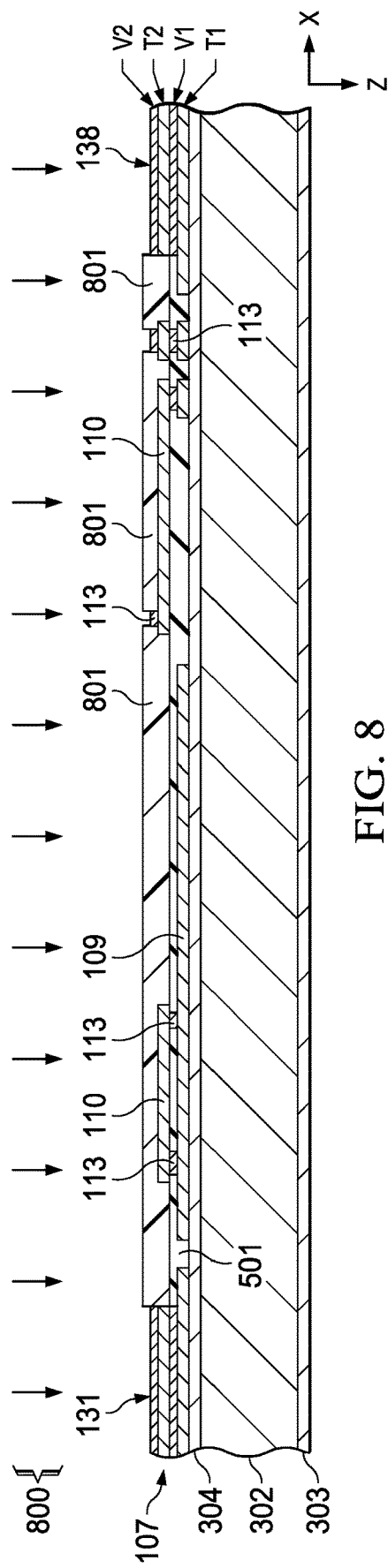

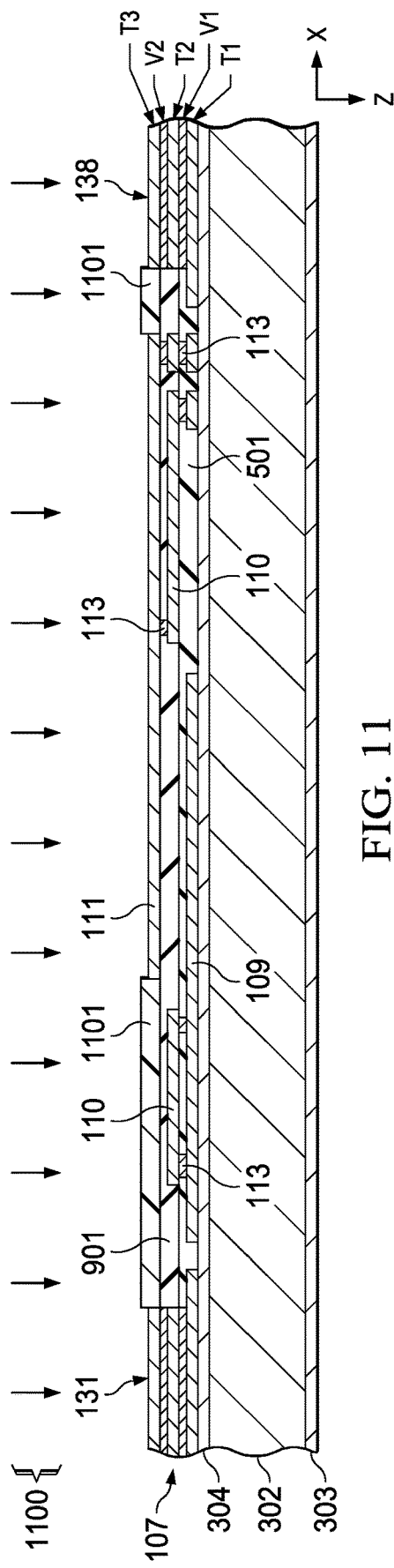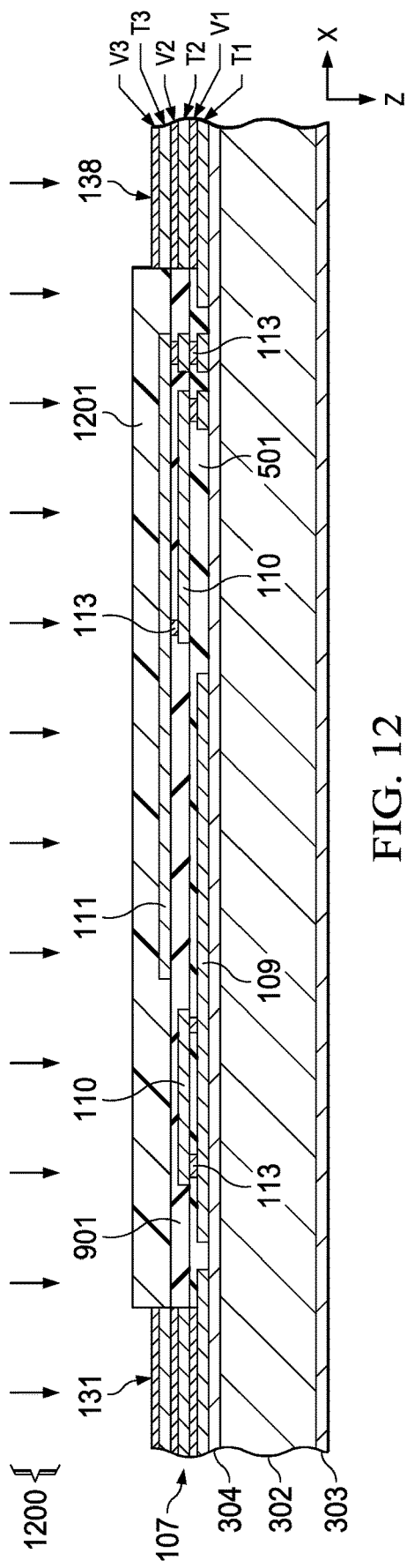

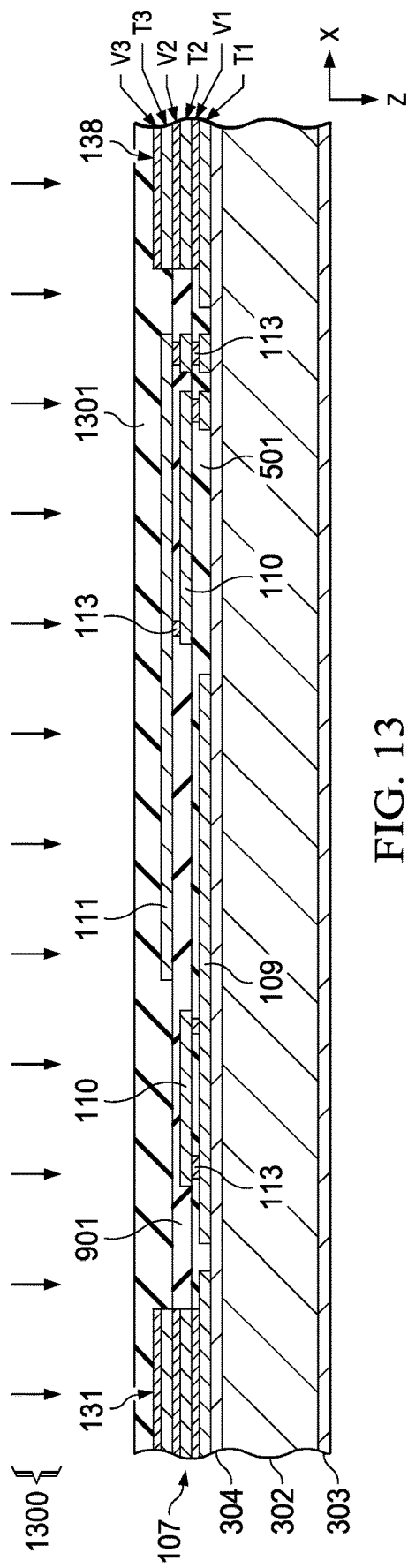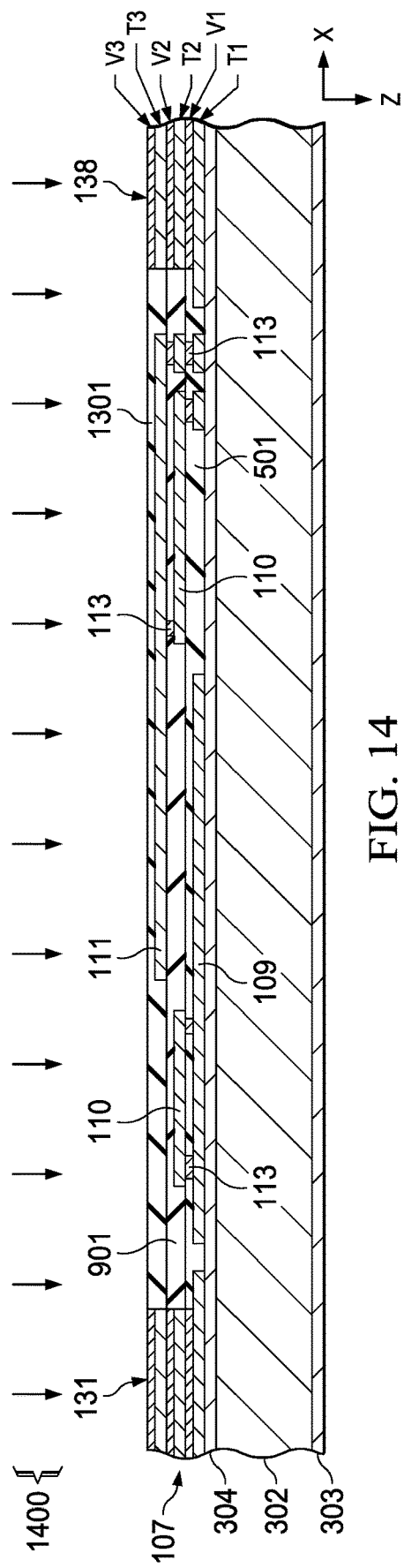
FIG. 13
FIG. 14

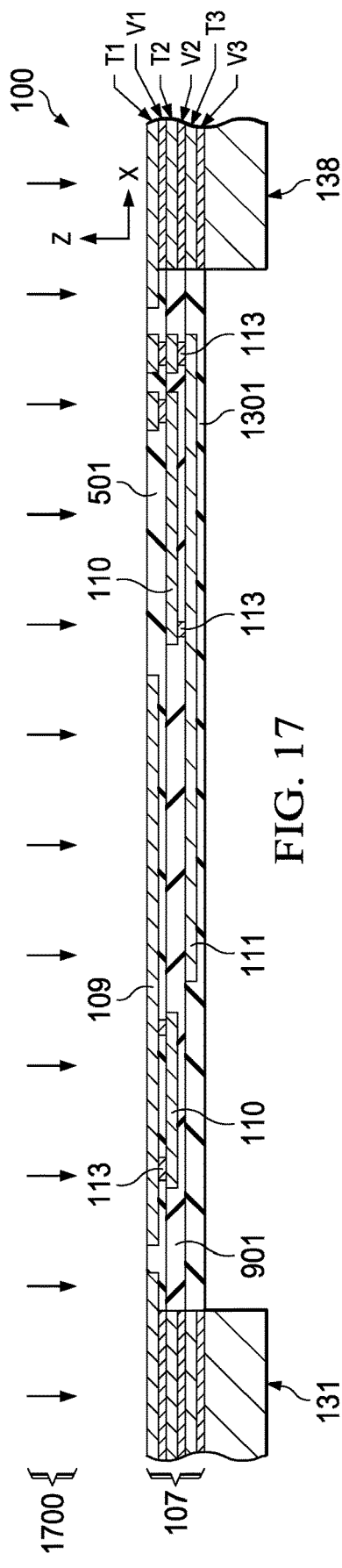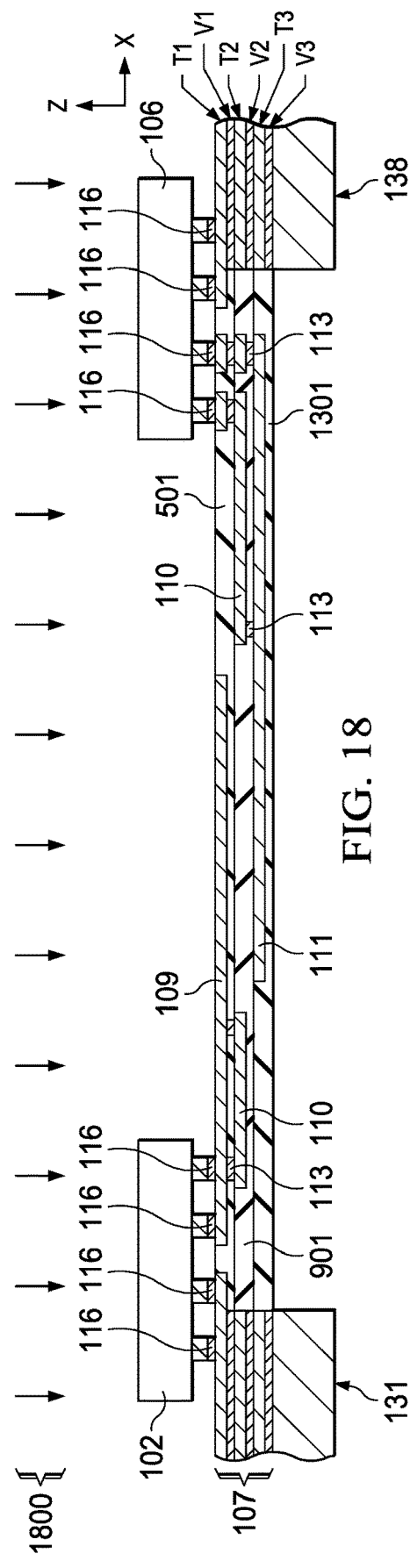

INTEGRATED MAGNETIC ASSEMBLY

CROSS-REFERENCE TO RELATED APPLICATION

This application claims priority to and benefit of U.S. Provisional Patent Application No. 63/056,344, filed on Jul. 24. 2020, and titled "COIL STRUCTURE IN ROUTABLE LEADFRAME TECHNOLOGY WITH ENHANCED PERFORMANCE FOR ISOLATION APPLICATION", the contents of which are hereby fully incorporated by reference.

BACKGROUND

Isolation transformers have coils to isolate two or more circuits from one another in power conversion, communications, and other applications. Isolation transformers can be manufactured in laminate structures. However, laminate transformers suffer from high cost, large form factor in body size and thickness, coarse design rule parameters, and delamination risk in production or in use.

SUMMARY

In one aspect, an electronic device includes a multilevel package substrate, conductive leads, a die, and a package structure. The multilevel package substrate has a first level, a second level, and a third level, each having patterned conductive features and molded dielectric features. The first level includes a first patterned conductive feature with multiple turns that form the first winding. The second level includes a second patterned conductive feature, and the third level includes a third patterned conductive feature with multiple turns that form a second winding. A first terminal of the die is coupled to the first end of the first winding, a second terminal of the die is coupled to the second end of the first winding, and a third terminal of the die is coupled to a first conductive lead. The package structure encloses the first die, the second die, and a portion of the multilevel package substrate.

In another aspect, a magnetic assembly includes a multilevel package substrate having a first level, a second level, and a third level. The first, second, and third levels each have patterned conductive features and molded dielectric features. The first level includes a first patterned conductive feature with multiple turns that form a first winding having a first end and a second end. The second level includes a second patterned conductive feature. The third level includes a third patterned conductive feature with multiple turns that form a second winding having a first end and a second end.

In a further aspect, a method for fabricating an electronic device includes fabricating a multilevel package substrate. The multilevel package substrate includes forming a first level on a carrier structure, the first level having first molded dielectric features and a first patterned conductive feature with multiple turns that form a first winding, forming a second level on the first level, where the second level has second patterned conductive features and second molded dielectric features, and forming a third level on the second level, where the third level has third molded dielectric features and a third patterned conductive feature with multiple turns that form a second winding. The method further includes removing the carrier structure from the first level, performing an electrical connection process that couples a first die and the first winding in a first circuit, and couples a second die and the second winding in a second circuit isolated from the first circuit, and performing a molding process that encloses a portion of the multilevel package substrate and the first and second dies in a package structure.

BRIEF DESCRIPTION OF THE DRAWINGS

FIGS. 3-22 are partial side elevation views of the electronic device of FIG. 1 undergoing fabrication according to the method of FIG. 2.

DETAILED DESCRIPTION

Figure 1:
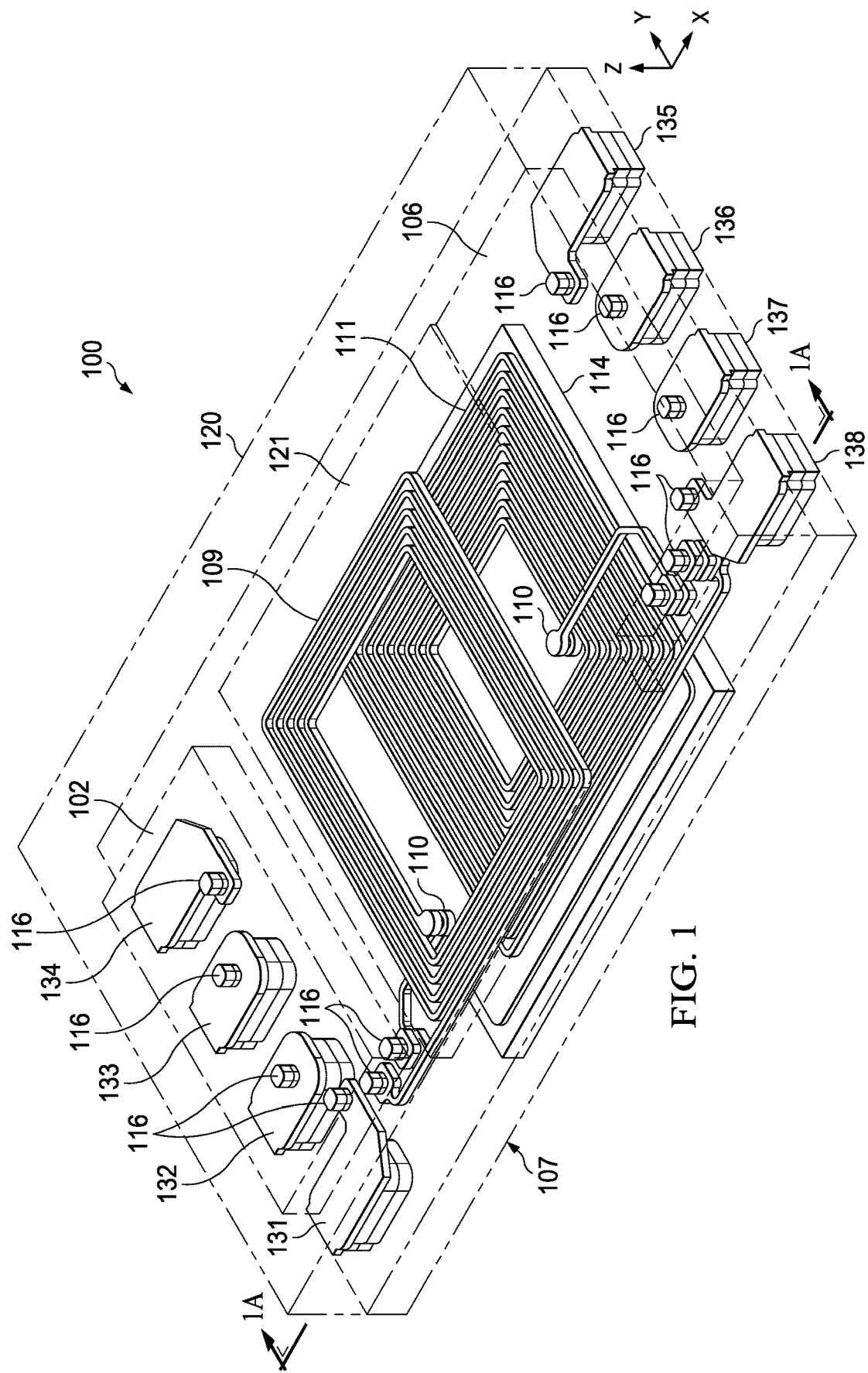
FIG. 1 is a top perspective view of a packaged electronic device that includes a magnetic assembly having primary and secondary coil windings formed in a multilevel package substrate and magnetic shields.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
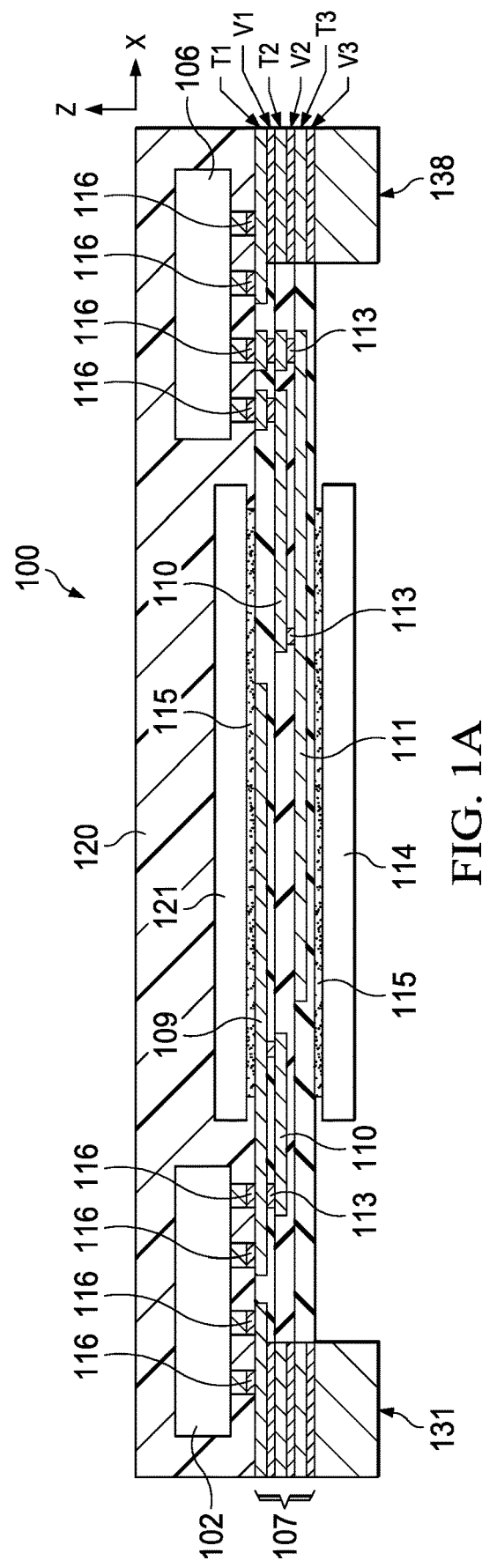
FIG. 1A is a partial sectional side elevation view of the multilevel package substrate taken along line 1A-1A in FIG. 1.
Figure 1B:
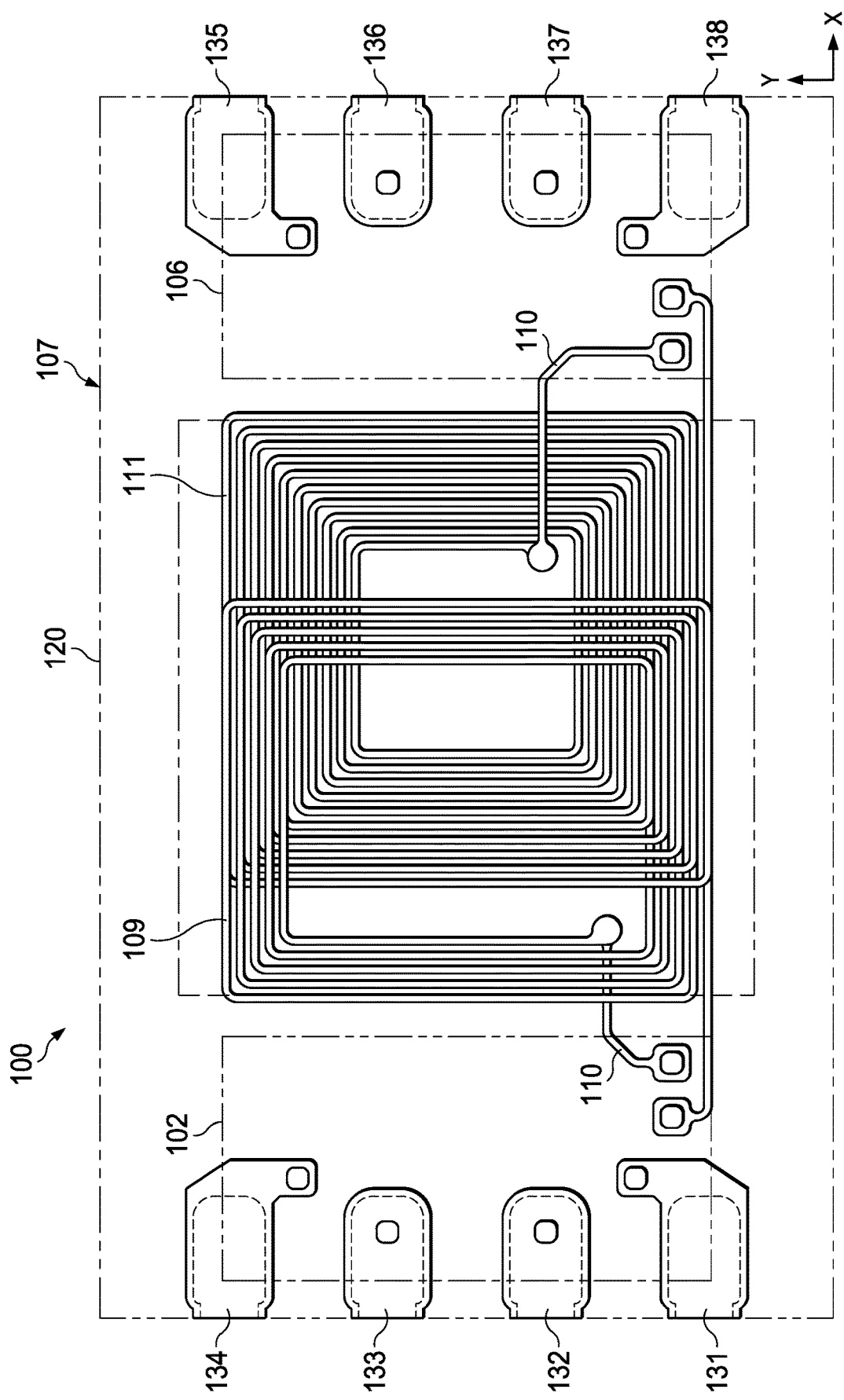
FIG. 1B is a top plan view of the multilevel package substrate of FIGS. 1 and 1A.

Referring to FIGS. 1, 1A and 1B, FIG. 1 shows a top perspective view of a packaged electronic device 100 having conductive leads, one or more semiconductor dies, and a magnetic assembly that includes a multilevel package substrate, in an integrated package. The electronic device 100 includes a first circuit associated with a first voltage domain (e.g., a high voltage primary circuit of an integrated power device or of a communications device) as well as a second circuit associated with a second voltage domain (e.g., an isolated lower voltage secondary circuit). The electronic device 100 includes a first semiconductor die 102 having electronic components therein that are interconnected in a first circuit, such as a primary circuit in one example. FIG. 1A shows a partial sectional side elevation view of the multilevel package substrate, and FIG. 1B shows a top plan view of the multilevel package substrate of FIGS. 1 and 1A.

The electronic device 100 also includes a second semiconductor die 106 having internal electronic components connected in a second circuit, such as a secondary circuit in the illustrated example. The first and second semiconductor dies 102 and 106 each include multiple conductive terminals that provide electrical interconnections with other structures to form the respective first and second circuits. In the illustrated example, the semiconductor dies 102 and 106 each include six conductive terminals formed as copper pillars that can be plated and soldered to conductive features to form electrical circuit connections. Some of the conductive terminals of the respective semiconductor dies 102 and 106 are soldered to conductive leads of the electronic device 100 and other conductive terminals are soldered to conductive features of the magnetic assembly.

The electronic device 100 includes a multilevel package substrate 107 having a first level that includes a first trace layer T1 and a first via layer V1 (FIG. 1A), a second level that includes a second trace layer T2 and a second via layer V2, and a third level that includes a third trace layer T3 and a third via layer V3. In other examples, the multilevel package substrate includes more or fewer than three levels. The first, second, and third levels T1, V1, T2, V2, T3, V3 each have patterned conductive features, such as copper, aluminum, or other conductive metal, as well as compression molded dielectric features between different conductive features and between adjacent levels. The molded dielectric features in one example are or include an electrically insulating dielectric material, where the thickness and material in the respective levels provide a withstanding voltage according to a desired voltage separation between the first and second circuits for a given design.

The first level includes a first patterned conductive feature 109 in the first trace layer T1. The first patterned conductive feature 109 has multiple turns that form a first winding (e.g., a primary winding). The first winding has a first end and a second end, each of which is electrically connected to a respective conductive terminal of the first semiconductor die 102 to couple the primary winding in the first circuit. The second level includes second patterned conductive features 110 in the second trace layer T2. The third level includes a third patterned conductive feature 111 and the third trace layer T3. The third patterned conductive feature 111 includes multiple turns that form a second winding (e.g., a secondary winding) having a first end and a second end. Two separate portions of the second patterned conductive features 110 in the second trace layer T2 provide return connections for the respective primary and secondary windings. The first and second ends of the second winding are electrically connected to respective conductive terminals of the second semiconductor die 106 to couple the secondary winding in the second circuit. The first second and third levels in this example each have conductive vias 113, some of which are numerically designated in the drawings. The vias 113 electrically interconnect certain conductive trace features of different levels.

The magnetic assembly in FIGS. 1, 1A and 1B includes a first (e.g., lower) magnetic shield 114 that is attached to a bottom side of the multilevel package substrate 107 by a nonconductive epoxy 115. The first trace layer T1 in this example also includes undercut or stepped features formed by selective etch-back of copper material of the first trace layer T1. In this example, the etched features include the first patterned conductive feature 109 that forms the first winding. Taller (e.g., unetched) portions of the first trace layer T1 provide electrical contacts 116 for electrical connection by soldering to corresponding conductive terminals of the respective first and second semiconductor dies 102 and 106.

The electronic device 100 also includes a package structure 120 that encloses the first die 102, the second die 106, and a portion of the multilevel package substrate 107. In one example, the package structure 120 is or includes a molded material, such as plastic. In another example, package structure 120 is or includes a ceramic material.

The magnetic assembly in this example also includes a second (e.g., upper) magnetic shield 121 that is attached to the top side of the multilevel package substrate 107 by a nonconductive epoxy 115. The package structure 120 in this example also encloses the second magnetic shield 121. In another example, one of the first and second magnetic shields 114, 121 is omitted. In a further example, both the magnetic shields 114 and 121 are omitted. When included, the magnetic shields 114 and 121 advantageously reduce or mitigate magnetic and electric field coupling into the first and second circuits from external sources, and reduce electromagnetic interference (EMI), radiofrequency interference (RFI) and other emissions from the first and second circuits to an external components in a host system. In addition, the magnetic shields 114 and 121 facilitate forming a magnetic circuit (e.g., a transformer) in combination with the primary and secondary windings formed by the respective patterned conductive features 109 and 111. In one example, the first magnetic shield 114 is the same size as the second magnetic shield 121. In another example, the first magnetic shield 114 is larger than the second magnetic shield 121. In another example, the first magnetic shield 114 is smaller than the second magnetic shield 121. In one example, one or both magnetic shields 114 and 121 are prefabricated magnetic cores attached using non-conductive epoxy paste 115. In another example, one or both magnetic shields 114 and 121 are or include a thick layer of magnetic paste formed on the respective side or sides of the multilevel package substrate 107.

As best shown in FIG. 1, the package structure 120 has respective first and second sides spaced apart from one another along a first direction (e.g., the X-direction designated in the drawings). The elongated lateral sides of the package structure 120 are spaced apart from one another along an orthogonal second direction (e.g., the Y-direction), and the top and bottom of the electronic device 100 are spaced apart from one another along an orthogonal third direction (e.g., the Z-direction).

The electronic device 100 also includes conductive leads 131, 132, 133, and 134 extending along the bottom and first lateral side of the package structure 120, as well as conductive leads 135, 136, 137, and 138 that extend along the bottom and the second lateral side of the package structure 120. The conductive leads 131-138 in one example are or include copper, aluminum, or other suitable conductive metal, and are formed as part of the fabrication of the multilevel package substrate 107. Portions of the conductive leads 131-138 are exposed along the bottom side of the electronic device 100 to facilitate soldering or other electrical connection to a host system, such as a printed circuit board (PCB, not shown).

The first semiconductor die 102 in one example includes a first terminal coupled to the first end of the first winding, a second terminal coupled to the second end of the first winding, and third, fourth, fifth, and sixth conductive terminals coupled to respective ones of the conductive leads 131-134 as shown in FIG. 1. In addition, the second semiconductor die 106 in this example has a first terminal coupled to the first end of the second winding, a second terminal coupled to the second end of the second winding, as well as third, fourth, fifth, and sixth conductive terminals coupled to respective ones of the conductive leads 135-138.

The multilevel package substrate 107 provides improved structural integrity and reduced size compared with laminated transformer designs and facilitates small form factor integrated electronic devices with high voltage isolation for automotive, industrial or other applications in which voltage isolation and small device size are important. The multilevel package substrate 107 in other examples is a component in a packaged electronic device (e.g., FIG. 23 below), and can be used in products having symmetric or asymmetric magnetic assembly positioning to provide a scalable solution to accommodate designs with differing electric field levels, efficiency and/or EMI performance specifications. For example, the multilevel package substrate 107 can be implemented in a magnetic assembly mounted with one or more semiconductor dies on a shared die attach pad or the magnetic assembly can be separately mounted on a conductive support structure or on portions of multiple isolated die attach pads that are spaced apart from integrated semiconductor dies and associated conductive die attach pads as in the example of FIG. 23.

Referring now to FIGS. 2-22, FIG. 2 shows a method 200 for fabricating an electronic device, and FIGS. 3-22 illustrates the example electronic device 100 undergoing fabrication processing according to the method 200. At 201, the method 200 includes fabricating a multilevel package substrate 107. In one example, the multilevel package substrate fabrication at 201 includes forming the first level (e.g., T1, V1) on a carrier structure, forming the second level (e.g., T2, V2) on the first level, and forming the third level (e.g., T3, V3) on the second level, after which the carrier structure is removed from the first level.

Figure 3:
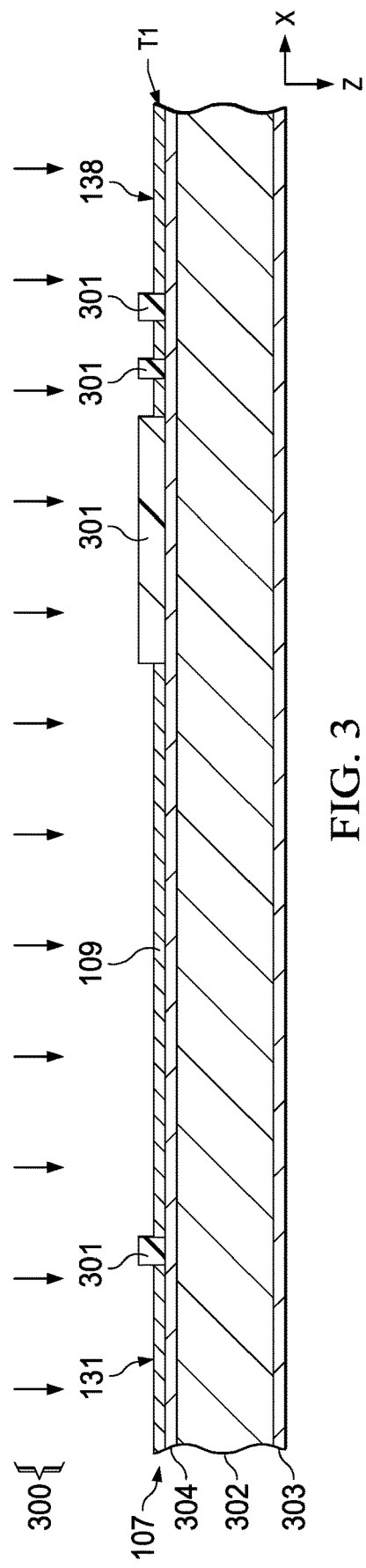

FIGS. 3-6 show formation of the first level of the multilevel package substrate 107 in one example, using an electroplating process 300 and a patterned plating mask 301. The illustrated example forms the first level having the first molded dielectric features, the first patterned conductive feature 109 with multiple turns that form the first winding, and initial portions of the conductive leads 131-138. The first level formation starts with forming the first trace layer T1 using a stainless-steel carrier 302, such as a panel or strip with multiple prospective package substrate sections, one of which is shown in FIG. 3. The carrier structure 302 includes thin copper seed layers 303 and 304 on the respective bottom and top sides of the carrier structure 302 to facilitate electroplating via the process 300. The electroplating process 300 deposits copper onto the upper seed layer 304 in the portions of the topside of the carrier structure that are exposed through the patterned plating mask 301.

Figure 4:
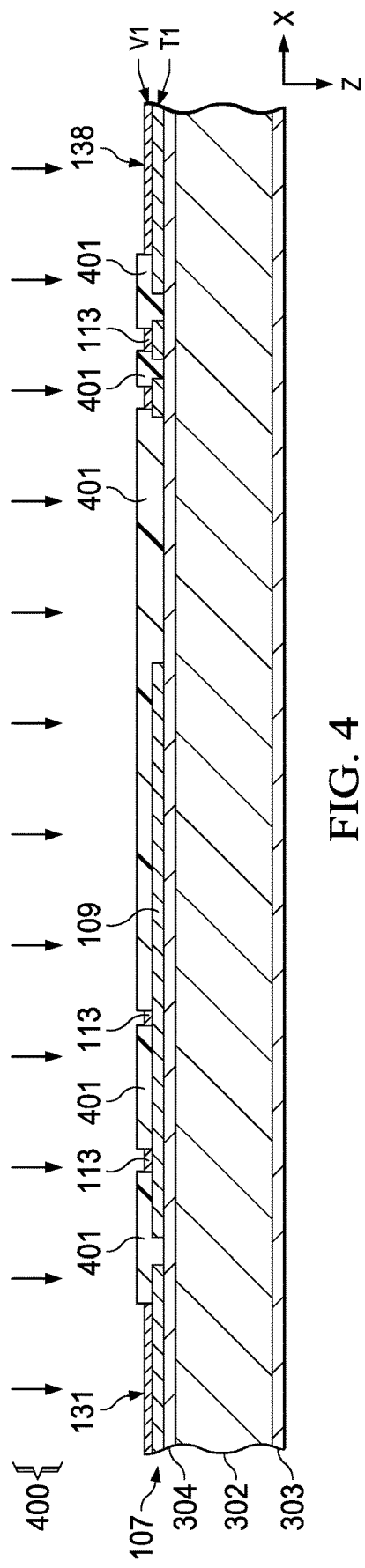

FIG. 4 shows the multilevel package substrate 107 after the process 300 is completed and the plating mask 301 has been removed to form the first via layer V1. A second electroplating process 400 is performed in FIG. 4 using a patterned second plating mask 401 (e.g., a copper pillar plating process). The electroplating process 400 deposits further copper to form the vias 113 and further portions of the conductive leads 131-138 of the first via level V1 in the areas exposed by the second plating mask 401. After the process 400 is completed, the second plating mask 401 is removed.

Figure 5:
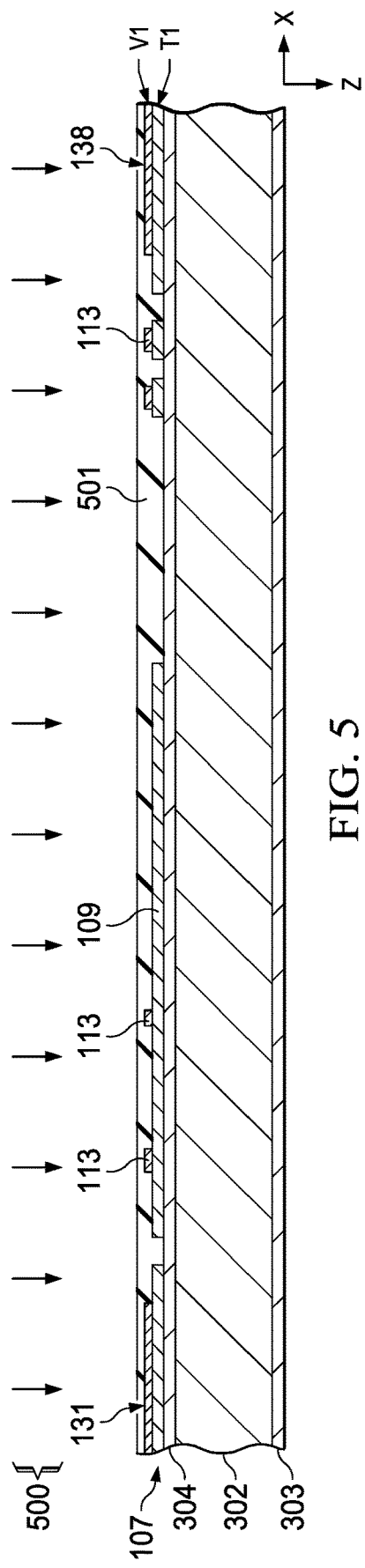
Figure 6:
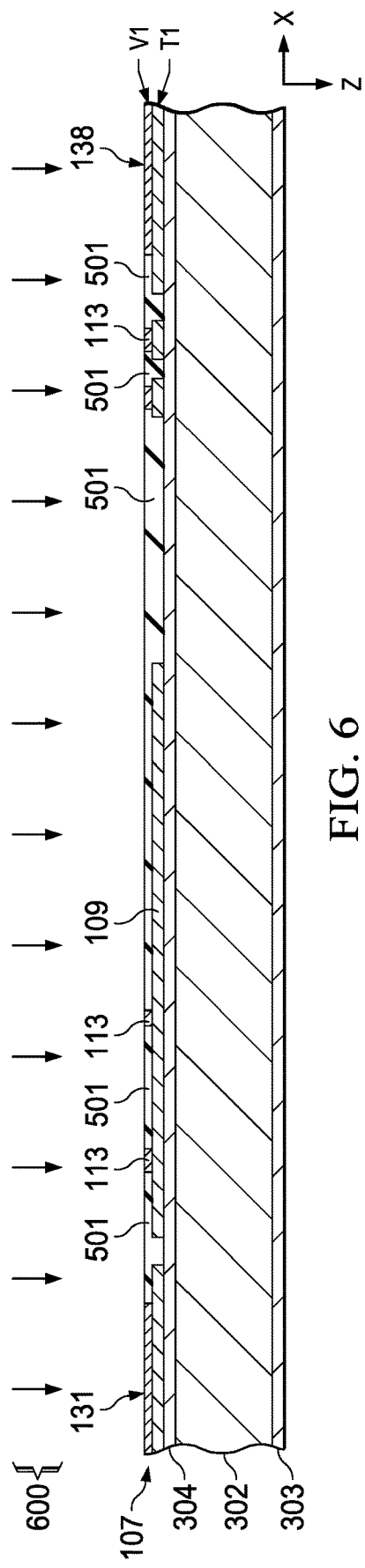

FIGS. 5 and 6 show the formation of the first molded dielectric features in the first level. A compression molding process 500 in FIG. 5 forms molded dielectric features 501 on exposed portions of the conductive features (e.g., coil 109) of the first trace layer T1 and the vias (e.g., 113) of the first via layer V1 to an initial thickness that covers the first trace layer T1 and the first via layer V1. A grinding process 600 is performed in FIG. 6, which grinds upper portions of the molded dielectric material 501 and exposes the upper portions of the first trace layer T1 and the first via layer V1. In another example, a chemical etch is used. In a further example, a chemical mechanical polishing process is used.

FIGS. 7-10 show formation of the second level of the multilevel package substrate 107, including forming the second trace layer T2, the second via layer V2 and the second molded dielectric features. In one example, the processing used to form the second level is similar to that used to form the first level, although not a requirement of all possible implementations. In the illustrated example, the second level processing forms the second level T2, V2 on the first level T1, V1, where the second level T2, V2 has the second patterned conductive features 110 and second molded dielectric features. FIG. 7 shows the multilevel package substrate 107 undergoing an electroplating process 700 with a patterned plating mask 701. The electroplating process 700 deposits copper onto the top side of the portions of the finished first level that are exposed through the plating mask 701 to form the second trace layer T2 including the second patterned conductive features 110 and further portions of the conductive leads 131-138. After the process 700 is completed, the plating mask 701 is removed.

FIG. 8 shows the multilevel package substrate 107 undergoing another electroplating process 800 using another plating mask 801 (e.g., a copper pillar plating process). The electroplating process 800 deposits further copper to form the vias 113 and further portions of the conductive leads 131-138 of the second via level V2 in the areas exposed by the plating mask 801. After the process 800 is completed, the plating mask 801 is removed.

Figure 9:
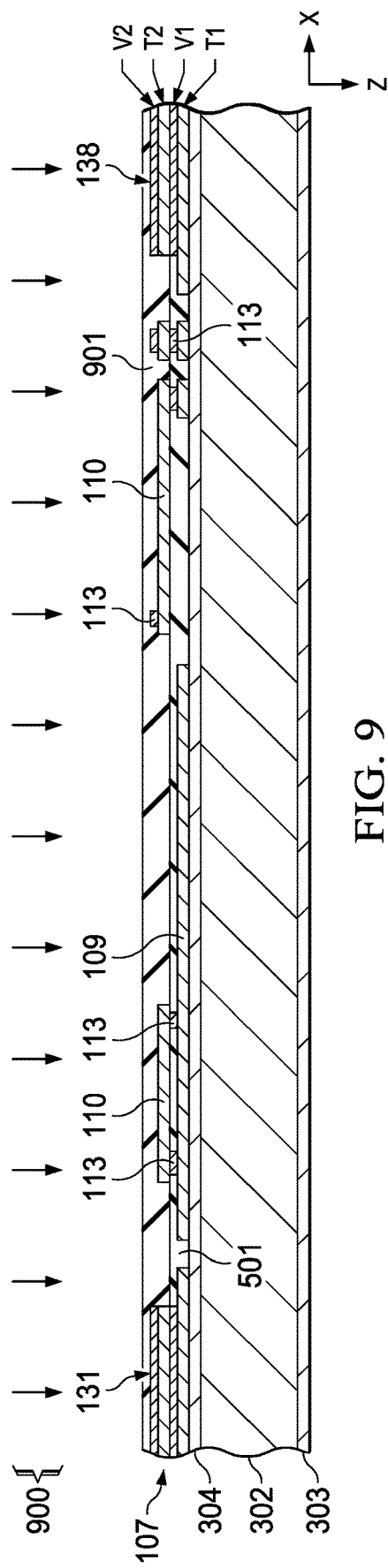
Figure 10:
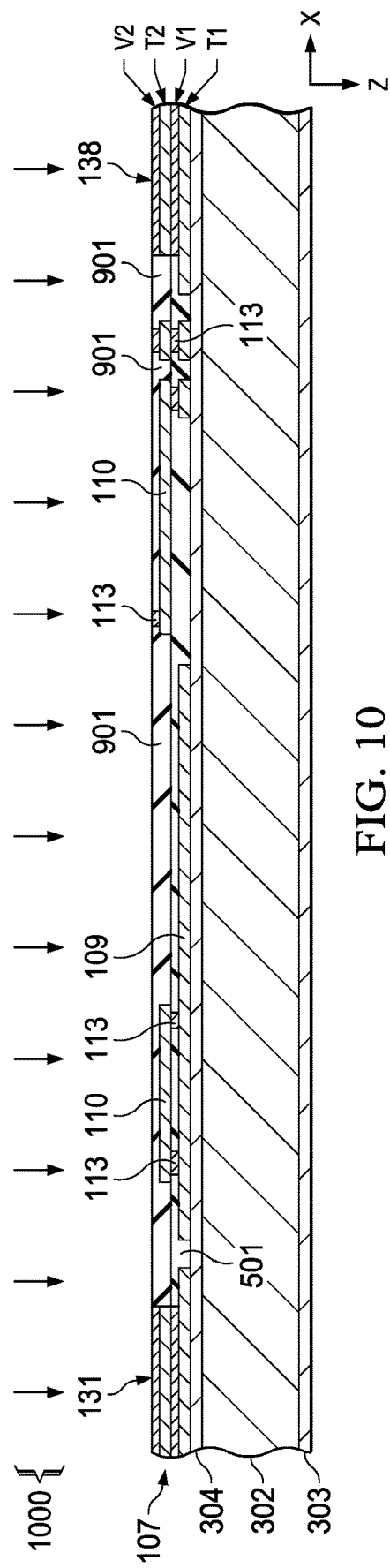

FIGS. 9 and 10 show formation of the second molded dielectric features in the second level using compression molding and grinding. A compression molding process 900 is performed in FIG. 9, which forms molded dielectric features 901 on exposed portions of the conductive features (e.g., coil return sections 110) of the second trace layer T2 and the vias (e.g., 113) of the second via layer V2 to an initial thickness that covers the second trace layer T2 and the second via layer V2. A grinding process 1000 is performed in FIG. 10, which grinds upper portions of the molded dielectric material 901 and exposes the upper portions of the second trace layer T2 and the second via layer V2. In another example, a chemical etch is used. In a further example, a chemical mechanical polishing process is used.

FIGS. 11-14 show formation of the third level of the multilevel package substrate 107, including forming the third trace layer T3, the third via layer V3, and the third molded dielectric features. In one example, the processing used to form the third level is similar to that used to form the first and second levels, although not a requirement of all possible implementations. In the illustrated example, the third level processing forms the third level T3, V3 on the second level T2, V2, where the third level T3, V3 has the third molded dielectric features, the third patterned conductive feature 111 with multiple turns that form the second winding, and further portions of the conductive leads 131-138.

FIG. 11 shows the multilevel package substrate 107 undergoing an electroplating process 1100 with a patterned plating mask 1101. The electroplating process 1100 deposits copper onto the top side of the portions of the finished second level that are exposed through the patterned plating mask 1101 to form the third trace layer T3 including the third patterned conductive features 111 and further portions of the conductive leads 131-138. After the process 1100 is completed, the plating mask 1101 is removed.

FIG. 12 shows the multilevel package substrate 107 undergoing another electroplating process 1200 using another plating mask 1201 (e.g., a copper pillar plating process). The electroplating process 1200 deposits further copper to form the vias 113 and further portions of the conductive leads 131-138 of the third via level V3 in the areas exposed by the plating mask 1201. After the electroplating process 1200, the plating mask 1201 is removed.

FIGS. 13 and 14 show the formation of the third molded dielectric features in the third level using compression molding and grinding. A compression molding process 1300 is performed in FIG. 13, which forms molded dielectric features 1301 on exposed portions of the conductive features of the third trace layer T3 and the vias (e.g., 113) of the third via layer V3 to an initial thickness that covers the third trace layer T3 and the third via layer V3. A grinding process 1400 is performed in FIG. 14, which grinds upper portions of the molded dielectric material 1301 and exposes the upper portions of the third trace layer T3 and the third via layer V3. In another example, a chemical etch is used. In a further example, a chemical mechanical polishing process is used.

Figure 15:
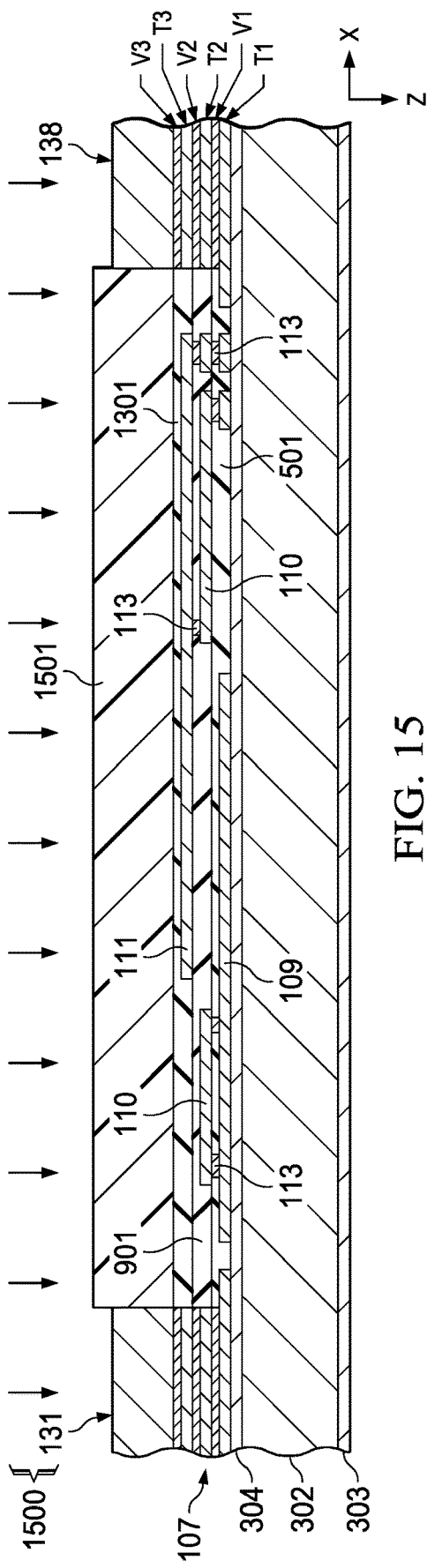
Figure 16:
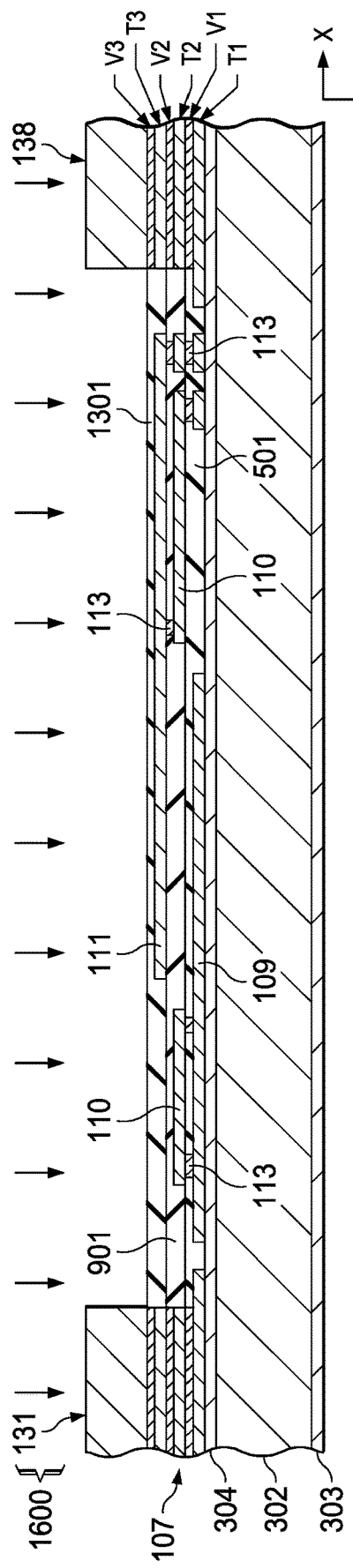

Referring also to FIGS. 15-17, the illustrated multilevel package substrate 107 has integrated leads 131-138, which are further extended along the Z direction in FIGS. 15 and 16. In FIG. 15, a further electroplating or other deposition processes 1500 is performed using a mask 1501. The process 1500 further extends the Z direction dimension of the conductive leads 131-138, and the mask 1501 is removed by a process 1600 in FIG. 16. In FIG. 17, a removal process 1700 is performed that removes the carrier structure 302, 303, 304 from the first level of the multilevel package substrate 107.

Figure 2:
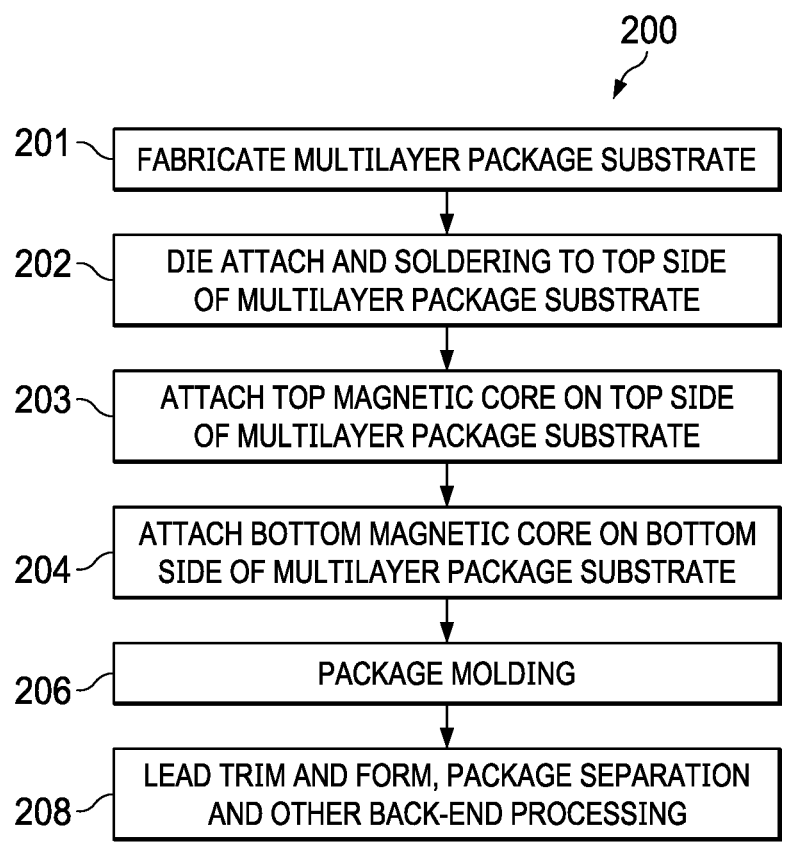
FIG. 2 is a flow diagram of a method for fabricating an electronic device.

The method 200 in FIG. 2 also includes die attach and soldering at 202 to solder one or more semiconductor dies to the top side of the multilevel package substrate 107. The soldering in this example provides an electrical connection process that couples the first die 102 and the first winding in the first circuit and couples the second semiconductor die 106 and the second winding in the second circuit isolated from the first circuit. In FIG. 18, solder is applied (e.g., dipped or otherwise deposited) onto the bottom sides of the conductive terminals of the semiconductor dies 102 and 106, and the semiconductor dies 102 and 106 are placed with the respective terminals on or over the respective electrical contacts 116 of the first trace layer Ti. A thermal solder reflow process 1800 is performed that solders the die terminals to the contacts 116.

Figure 19:
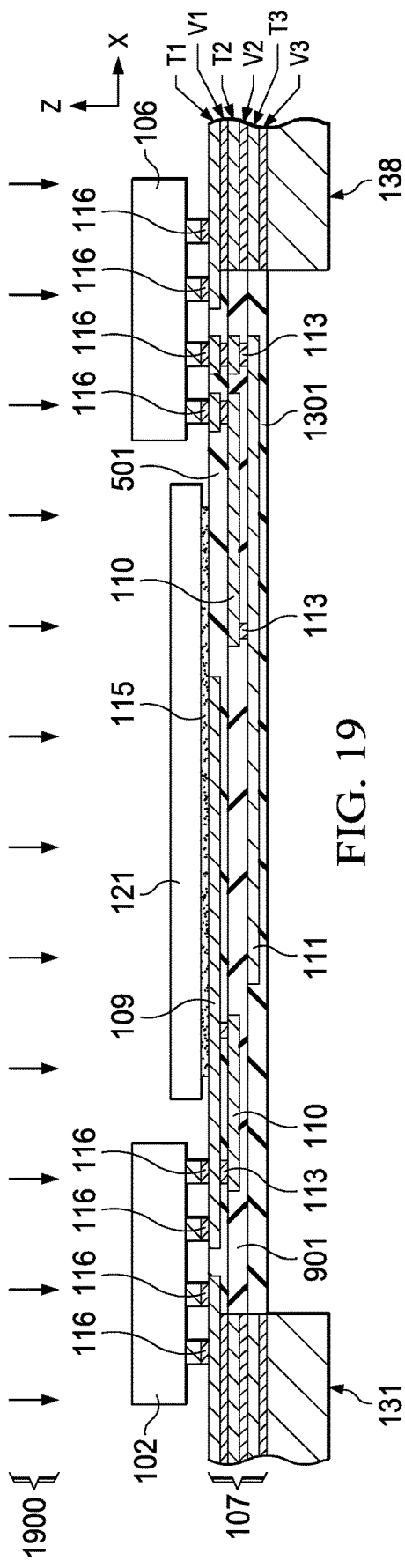
Figure 20:
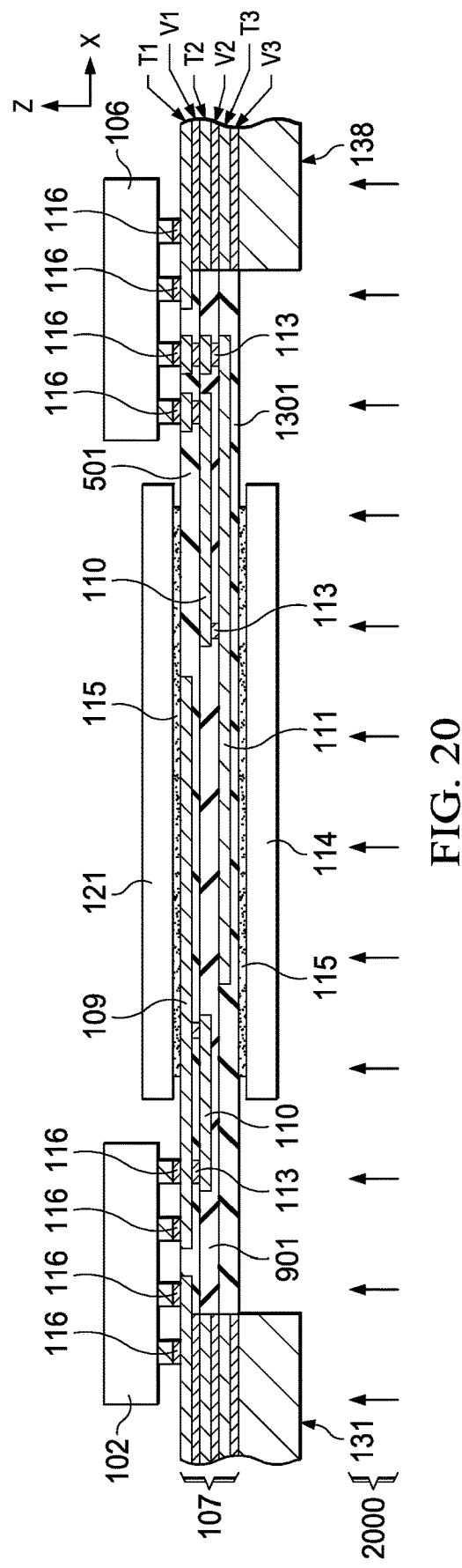
Figure 21:
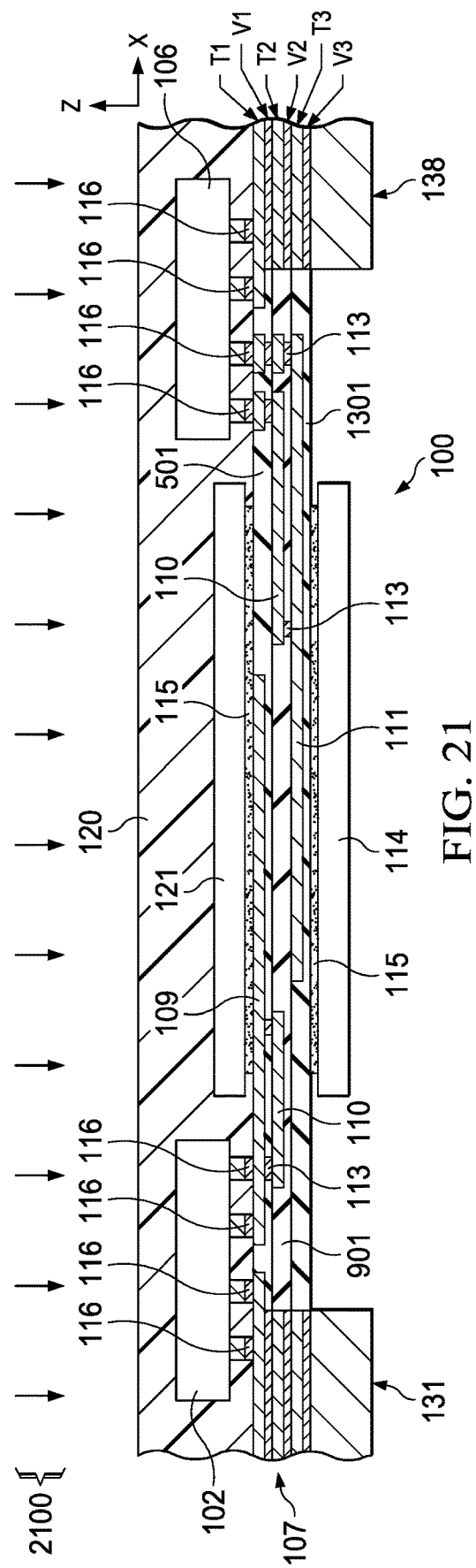
Figure 22:
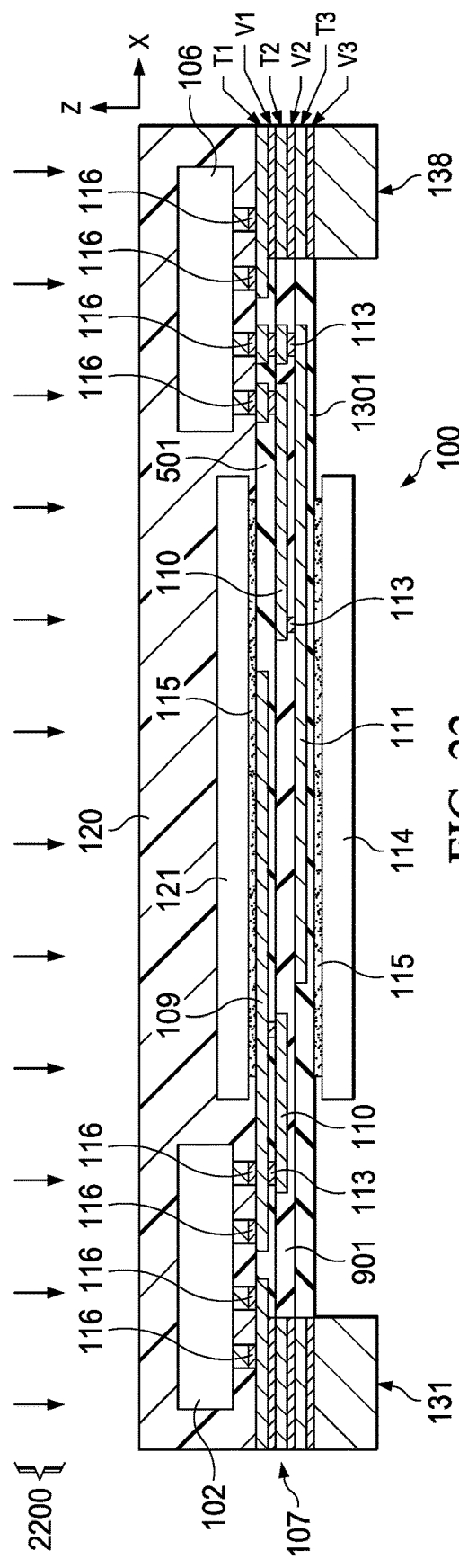

The method 200 further includes attaching one or more magnetic shields to one or both sides of the multilevel package substrate 107 at 203 and 204. At 203, the upper magnetic shield 121 is attached by non-conductive epoxy 115 to the top side of the multilevel package substrate 107 laterally between the semiconductor dies 102 and 106 and at least partially over portions of the first and second windings of the multilevel package substrate 107. FIG. 19 shows an example, in which an attachment process 1900 is performed that attaches the magnetic shield 121 to the top side of the multilevel package substrate 107 using the epoxy 115. At 204 in FIG. 2, the lower magnetic shield 114 is attached by non-conductive epoxy 115 to the bottom side of the multilevel package substrate 107 laterally between the sets of leads and at least partially under portions of the first and second windings of the multilevel package substrate 107. FIG. 20 shows an example, in which an attachment process 2000 is performed that attaches the magnetic shield 114 to the bottom side of the multilevel package substrate 107 using the epoxy 115.

The method 200 continues at 206 in FIG. 2 with package molding. FIG. 12 shows one example, in which a molding process 2100 is performed that encloses a portion of the multilevel package substrate 107, the upper magnetic shield 121, the first and second dies 102 and 106 in the package structure 120. A package separation process 2200 is performed in FIG. 22 (e.g., sawing, laser cutting, etc.) that separates individual packaged electronic devices 100 from a panel of concurrently processed devices at 208 in FIG. 2.

The finished electronic device 100 (e.g., FIGS. 1, 1A, 1B, 22) has integrated leads 131-138 and semiconductor dies 102, 106 to provide an isolated product in a small form factor suitable for soldering to a host PCB. The multilevel package substrate 107 allows design flexibility through mask designs and process parameter selections to provide an isolation solution for a variety of applications with low manufacturing risk and allows for the use of top and/or bottom magnetic shields 121, 114 to block unwanted noise coupling from the coil to sensitive metal leads. The examples having one or more shields facilitate better coil performance such as quality factor, DC/AC resistance, reduced noise coupling, etc. In one example implementation, the electronic device 100 is approximately 200 um thick, with lateral dimensions of 5×3 mm and a primary to secondary transformer turns ratio n=1.6.

In this example, the dielectric layers of the three-layer package substrate 107 are or include MJ1 ABF RLF dielectric material, and the package structure 120 is or includes Carsem/TITL mold compound. In this example, moreover, the multilevel package substrate 107 has the following dimensions in um: tracel etch-back depth, 0 min., 5 max.; trace 1 thickness, 25 min. 35 target, 45 max.; via 1 thickness, 35 target; trace 2 thickness, 25 min., 35 target, 45 max.; via 2 thickness, 35 target; trace 3 thickness, 20 min., 30 target, 40 max.; via 3 thickness, 30 target; via 2 etch-back, 5 target, 10 max; SMT stud, 20 min., 30 target, 40 min.; and pre-mold thickness, 170 min., 200 target, 230 max. In one example, all or portions of the leads 131-138 are or include copper studs formed as described above as part of the substrate fabrication processing. In another example, all or portions of the conductive leads are or include solder balls. In one example, the magnetic shields have Z-direction thicknesses of 279 um and the non-conductive epoxy 115 is approximately 25 um thick.

Figure 23:
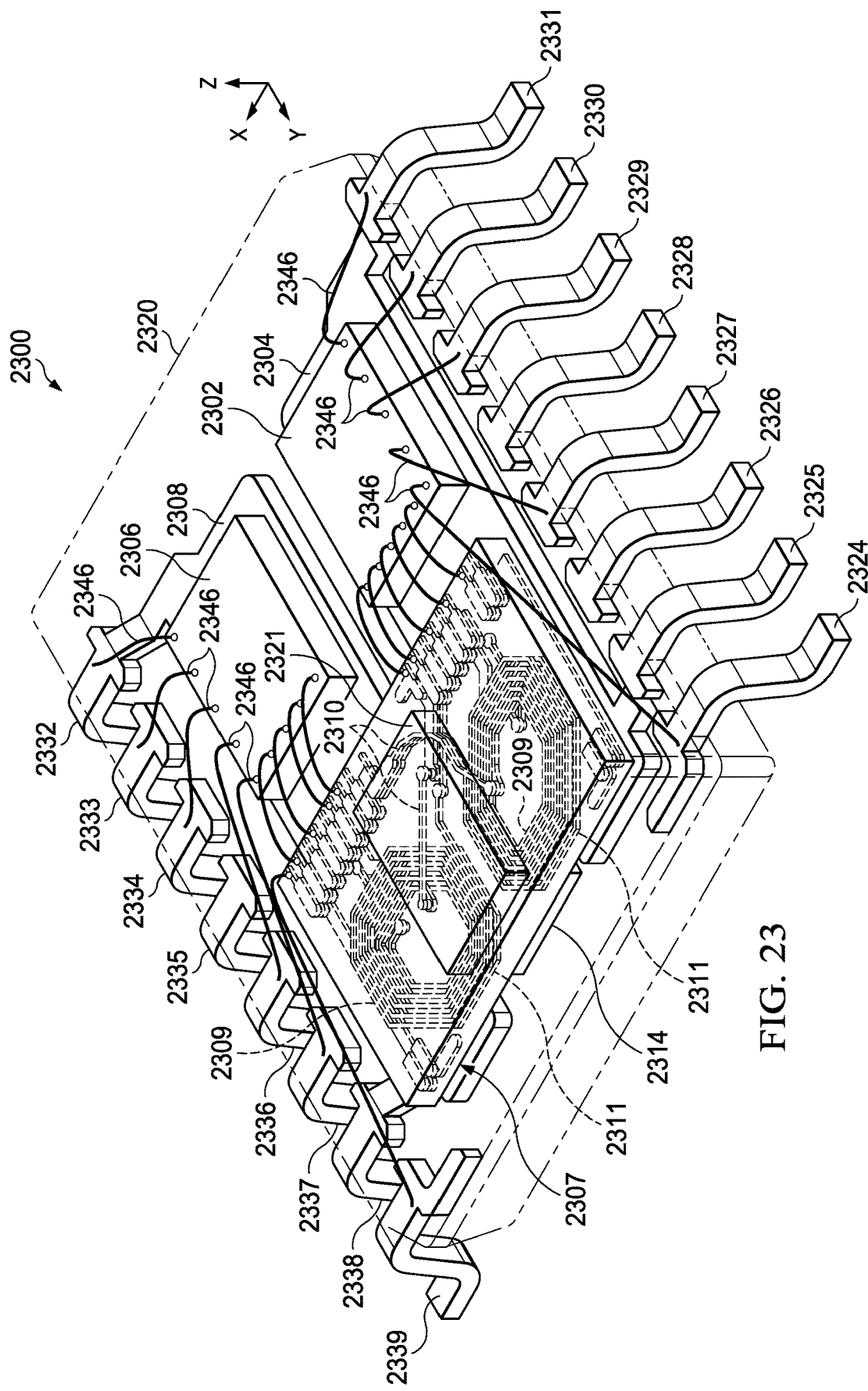
FIG. 23 is a top perspective view of another packaged electronic device having a magnetic assembly with primary and secondary coil windings formed in a multilevel package substrate and magnetic shields.
Figure 23A:
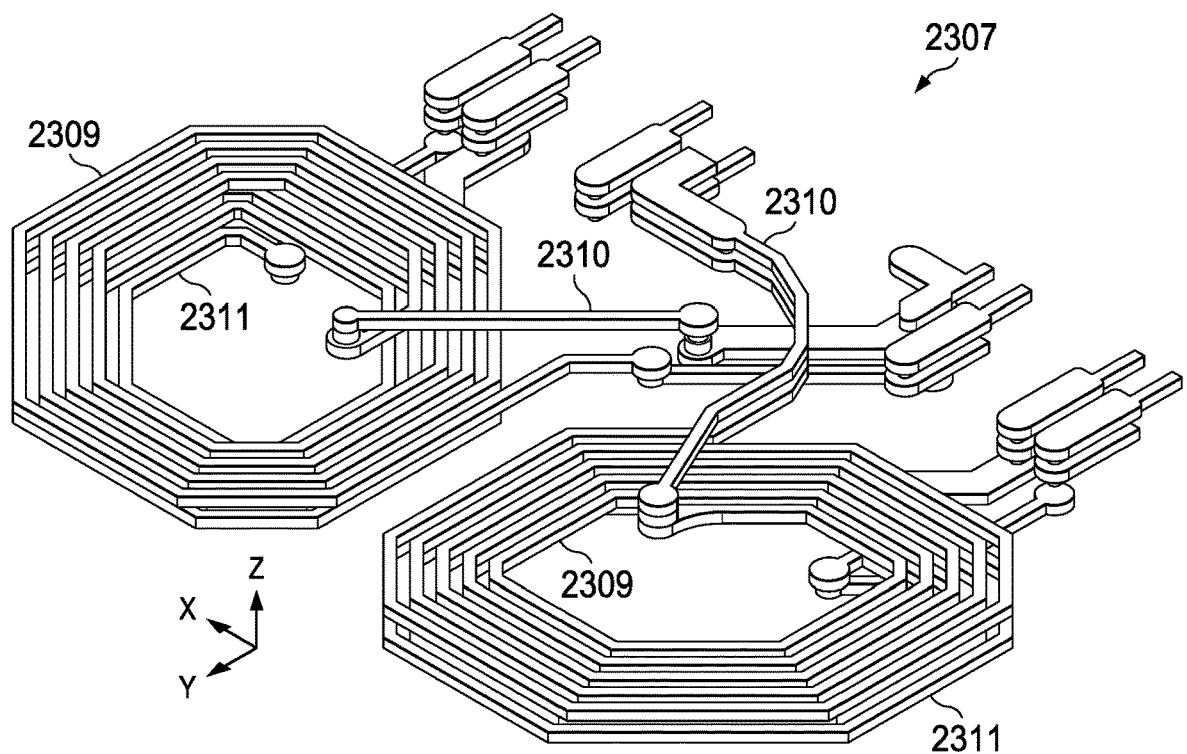
FIG. 23A is a top perspective view of conductive trace layers in the multilevel package substrate of FIG. 23.
Figure 23C:
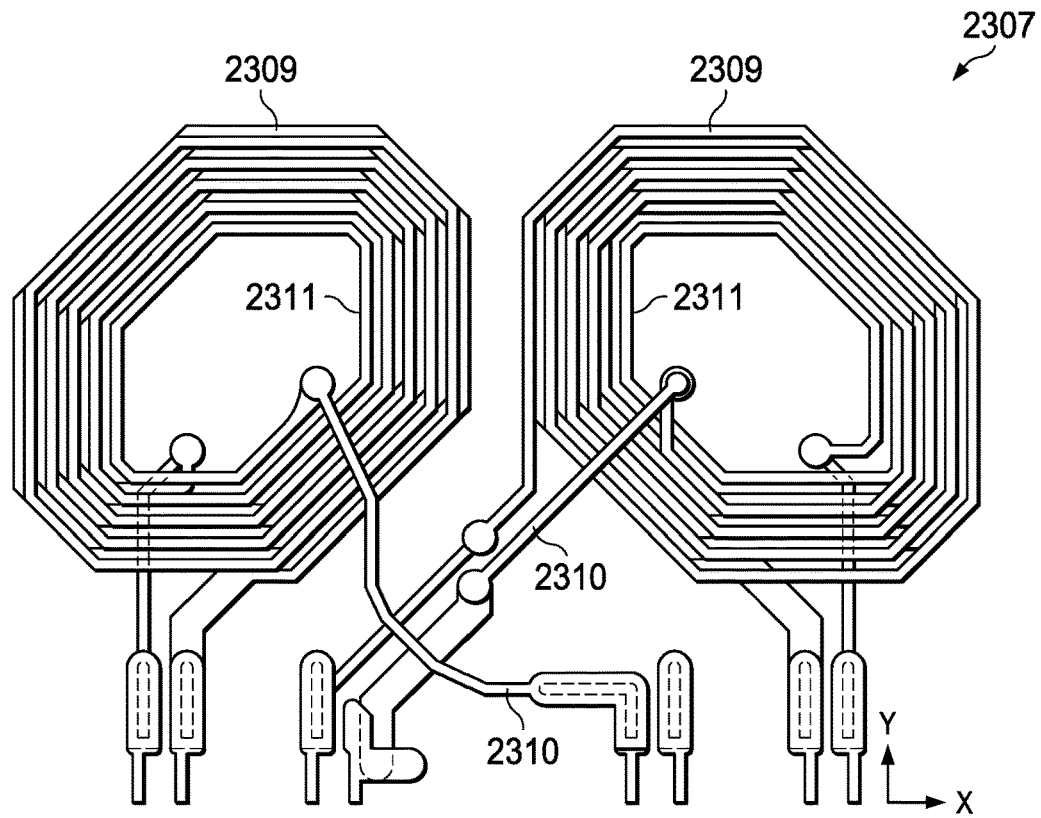
FIG. 23C is a top plan view of the multilevel package substrate of FIGS. 23, 23A and 23B.

Referring to FIGS. 23-23C, FIG. 23 shows another example packaged electronic device 2300 in a small outline integrated circuit (SOIC) package type with gull wing leads on opposite first and second sides spaced from one another along a first direction labelled "X". Other packaged electronic device types and forms can be provided in different implementations, having conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 2300 includes a ball grid array (BGA) package or a land grid array (LGA) type, such as a mold array process ball grid array (MAPBGA) or an over-molded BGA (e.g., plastic BGA or PBGA). The example electronic device 2300 provides electrical interconnections for first and second electrical circuits, some or all of which are implemented using bond wires. In other implementations, different forms of interconnection types can be used, including substrate-based interconnections (BGA, LGA, etc.), in which a substrate includes electrical interconnections and signal routing structures (e.g., copper or aluminum traces on one or more layers or levels) alone or in combination with bond wire electrical connections.

As shown in FIG. 23, the example device 2300 includes conductive features (e.g., conductive die attach pads or supports) for mounting and supporting first and second semiconductor dies and a laminated magnetic assembly. The die attach pads and device leads can include any suitable conductive structures, such as copper, aluminum, etc. The example device 2300 in FIG. 23 includes a first semiconductor die 2302 attached to a first conductive die attach pad 2304 of a starting lead frame assembly. The device 2300 also includes a second semiconductor die 2306 attached to a second conductive die attach pad 2308. The electronic device 2300 also includes a multilevel package substrate 2307 attached to the die attach pads 2304 and 2308. The multilevel package substrate 2307 in this example is similar to the multilevel package substrate 107, but has terminals formed in the first and second levels for bond wire connections in the electronic device 2300 instead of solderable leads. In other implementations, a multilevel package substrate has combinations of conductive leads for soldering to a host PCB or other substrate, as well as terminals for bond wire connections.

Figure 23B:
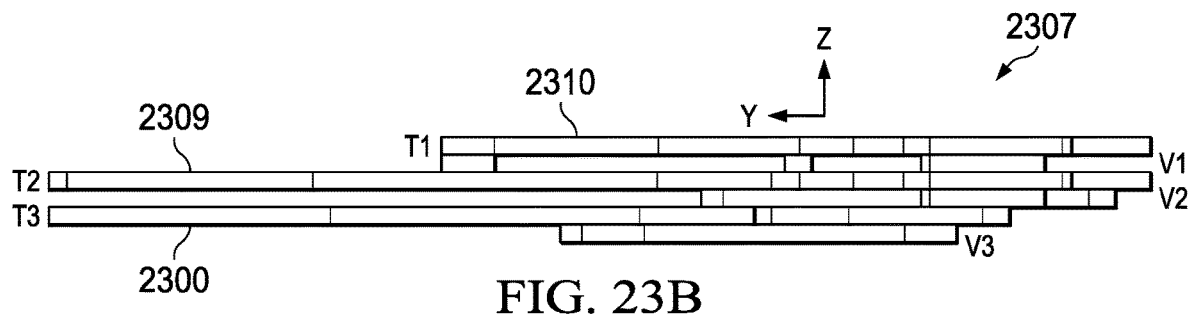
FIG. 23B is a side elevation view of the conductive trace layers in the multilevel package substrate of FIGS. 23 and 23A.

The electronic device 2300 includes a first circuit associated with a first voltage domain and a second circuit associated with a second voltage domain. The electronic device 2300 includes a first semiconductor die 2302 attached to a first die attach pad 2304. The first semiconductor die 2302 has electronic components therein that are interconnected in the first circuit, such as a primary circuit in one example. FIG. 23A shows a top perspective view of conductive trace layers in the multilevel package substrate 2307. FIG. 23B shows a side elevation view of the conductive trace layers in the multilevel package substrate 2307, and FIG. 23C shows a top plan view of the multilevel package substrate 2307.

The electronic device 2300 also includes a second semiconductor die 2306 attached to a second die attach pad 2308. The second semiconductor device 2306 has internal electronic components connected in the second circuit, such as a secondary circuit in the illustrated example. The first and second semiconductor dies 2302 and 2306 each include multiple conductive terminals, such as copper pillars, that provide connection points for bond wire connections 2346 to form electrical interconnections with other structures to form the respective first and second circuits. Some of the conductive terminals of the respective semiconductor dies 2302 and 2306 are soldered to conductive leads of the electronic device 2300 and other conductive terminals are soldered to conductive features of the multilevel package substrate 2307. In one example, the first and second semiconductor dies 2302 and 2306 are bumped dies having plated copper posts (e.g., copper pillar bumps) on the die, which are soldered to conductive features in the tope side of the multilevel package substrate 107 in the example of FIG. 1 or wire bonded to the respective circuit connections in the example of FIG. 23.

The multilevel package substrate 2307 has a first level that includes a first trace layer T1 and a first via layer V1 (e.g., FIG. 23B), a second level that includes a second trace layer T2 and a second via layer V2, and a third level that includes a third trace layer T3 and a third via layer V3. In other examples, the multilevel package substrate includes more or fewer than three levels. The first, second, and third levels T1, V1, T2, V2, T3, V3 each have patterned conductive features, such as copper, aluminum, or other conductive metal, as well as compression molded dielectric features between different conductive features and between adjacent levels. The molded dielectric features in one example are or include electrically insulating dielectric material, where the thickness and material in the respective levels provide a withstanding voltage according to a desired voltage separation between the first and second circuits for a given design. The multilevel package substrate 2307 in one example can be fabricated according to the processing at 201 in FIG. 2 as illustrated and described above.

The first level of the multilevel package substrate 2307 includes a first patterned conductive feature 2309 in the first trace layer T1. The first patterned conductive feature 2309 has multiple turns that form a pair of first windings (e.g., primary windings). The individual first windings each have a first end and a second end, each of which is electrically connected to a respective conductive terminal of the multilevel package substrate 2307 to couple the primary winding in the first circuit. The second level includes second patterned conductive features 2310 in the second trace layer T2. The third level includes a third patterned conductive feature 2311 and the third trace layer T3. The third patterned conductive feature 2311 includes multiple turns that form a pair of second windings (e.g., secondary windings), each having a first end and a second end. Portions of the second patterned conductive features 2310 in the second trace layer T2 provide return connections for the respective primary and secondary windings. The first and second ends of the second winding are electrically connected to respective conductive terminals of the multilevel package substrate 2307 to couple the secondary winding in the second circuit. The first second and third levels in this example each have conductive vias that electrically interconnect certain conductive trace features of different levels. The magnetic assembly includes a first (e.g., lower) magnetic shield 2314 that is attached to a bottom side of the multilevel package substrate 2307 by a nonconductive epoxy.

The electronic device 2300 also includes a package structure 2320 that encloses the first die 2302, the second die 2306, and the multilevel package substrate 2307. In one example, the package structure 2320 is or includes a molded material, such as plastic. In another example, the package structure 2320 is or includes a ceramic material.

The magnetic assembly in this example also includes a second (e.g., upper) magnetic shield 2321 that is attached to the top side of the multilevel package substrate 2307 by a nonconductive epoxy. The package structure 2320 in this example also encloses the second magnetic shield 2321. In another example, one of the first and second magnetic shield 2314, 2321 is omitted. In a further example, both the magnetic shields 2314 and 2321 are omitted. When included, the magnetic shields 2314 and 2321 advantageously reduce or mitigate magnetic and electric field coupling into the first and second circuits from external sources, and reduce electromagnetic interference (EMI), radiofrequency interference (RFI) and other emissions from the first and second circuits to an external components in a host system. In addition, the magnetic shields 2314 and 2321 facilitate forming a magnetic circuit (e.g., a transformer) in combination with the primary and secondary winding formed by the respective patterned conductive features 2309 and 2311. In one example, the first magnetic shield 2314 is the same size as the second magnetic shield 2321. In another example, the first magnetic shield 2314 is larger than the second magnetic shield 2321. In another example, the first magnetic shield 2314 is smaller than the second magnetic shield 2321. In one example, one or both magnetic shields 2314 and 2321 are prefabricated magnetic cores attached using non-conductive epoxy paste. In another example, one or both magnetic shields 2314 and 2321 are or include a thick layer of magnetic paste formed on the respective side or sides of the multilevel package substrate 2307.

The package structure 2320 has respective elongated first and second sides spaced apart from one another along a first direction (e.g., the X-direction designated in the drawings). The other lateral sides of the package structure 2320 are spaced apart from one another along an orthogonal second direction (e.g., the Y direction), and the top and bottom of the electronic device 2300 are spaced apart from one another along an orthogonal third direction (e.g., the Z direction).

The electronic device 2300 also includes conductive leads 2324-2331 extending outward and down from the first lateral side of the package structure 120, as well as conductive leads 2332-2339 that extend outward and down from the second lateral side of the package structure 120. The conductive leads 2324-2339 in one example are or include copper, aluminum, or other suitable conductive metal, and are formed as part a starting lead frame and later trimmed and formed into the illustrated gull wing shapes. Bottom portions of the conductive leads 2324-2339 facilitate soldering or other electrical connection to a host system, such as a printed circuit board (PCB, not shown). The package structure 2320 in this example encloses the multilevel package substrate 2307 and portions of the conductive leads 2324-2339.

The first semiconductor die 2302 in one example includes a first terminal coupled to the first end of the first winding, a second terminal coupled to the second end of the first winding, and third, fourth, fifth, and sixth conductive terminals coupled to respective ones of the conductive leads 2324-2331 as shown in FIG. 23. In addition, the second semiconductor die 2306 in this example has a first terminal coupled to the first end of the second winding, a second terminal coupled to the second end of the second winding, as well as third, fourth, fifth, and sixth conductive terminals coupled to respective ones of the conductive leads 2332-2339.

The multilevel package substrate 2307 provides improved structural integrity and reduced size compared with laminated transformer designs and facilitates small form factor integrated electronic devices with high voltage isolation for automotive, industrial or other applications in which voltage isolation and small device size are important.

Figure 24:
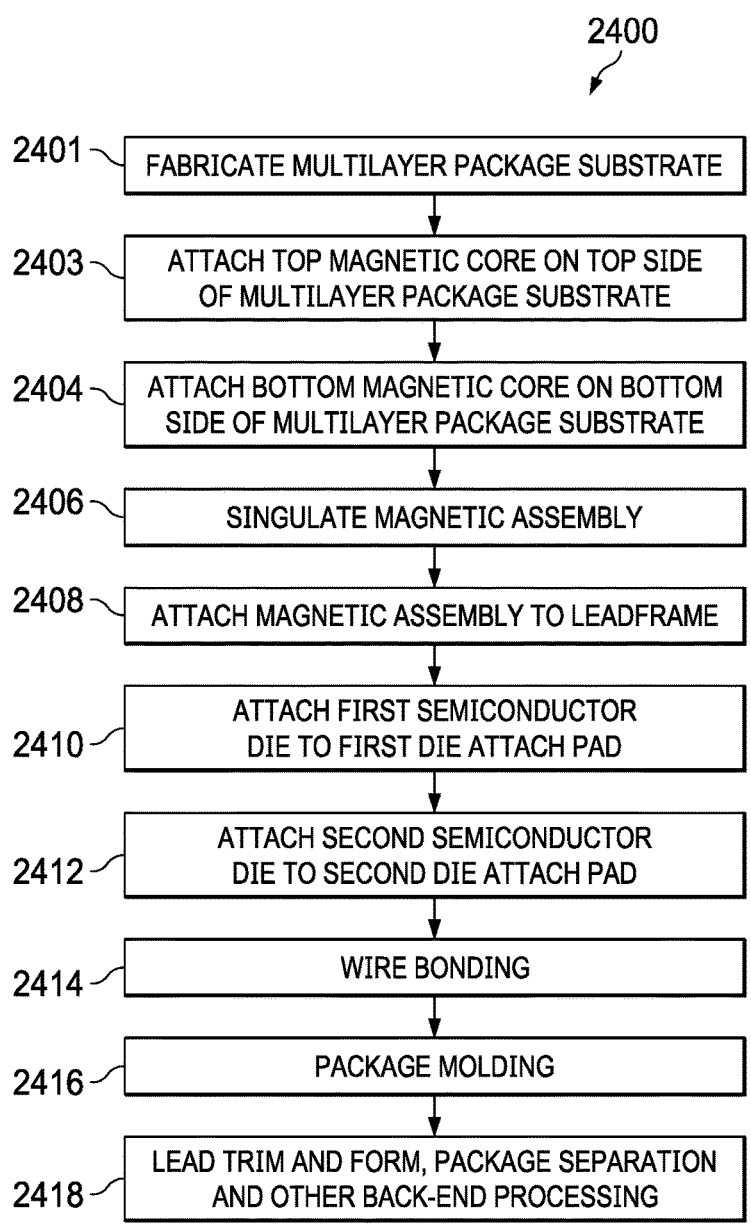
FIG. 24 is a flow diagram of another method for fabricating an electronic device.

FIG. 24 shows another method 2400 for fabricating an electronic device. At 2401, the method 2400 includes fabricating a multilevel package substrate 2307. In one example, the multilevel package substrate fabrication at 2401 includes forming the first level (e.g., T1, V1) on a carrier structure, forming the second level (e.g., T2, V2) on the first level, and forming the third level (e.g., T3, V3) on the second level, after which the carrier structure is removed from the first level, for example, as illustrated and described above in connection with FIGS. 2-17.

The method 2400 also includes attaching one or more magnetic shields to one or both sides of the multilevel package substrate 2307 at 2403 and 2404. At 2403, the upper magnetic shield 2321 is attached by non-conductive epoxy to the top side of the multilevel package substrate 2307, at least partially over portions of the first and second windings of the multilevel package substrate 2307. At 2404, the lower magnetic shield 2314 is attached by non-conductive epoxy to the bottom side of the multilevel package substrate 2307, at least partially under portions of the first and second windings of the multilevel package substrate 2307. The method 200 also includes singulating individual magnetic assemblies from a strip or panel at 2406 and attaching a singulated magnetic assembly at 2408 to a corresponding lead frame. In one example, the lead frame is a panel or strip that includes multiple prospective electronic device portions arranged in an array for concurrent processing before final package separation at 2418.

At 2410 and 2412 in FIG. 24, the method 200 continues with semiconductor die attach and soldering at 2402 to solder one or more semiconductor dies to the top side of the multilevel package substrate 2307. The soldering in this example provides an electrical connection process that attaches the first semiconductor die 2302 to the first die attach pad 2304 and attaches the second semiconductor die 2306 to the second die attach pad 2308 (e.g., FIG. 23). A wire bonding process or other electrical interconnection processing is performed at 2414 to form the bond wires 2346 in FIG. 23 to interconnect the first semiconductor die 2302 and the first winding in the first circuit, and to interconnect the second semiconductor die 2306 and the second winding in the second circuit isolated from the first circuit. The panel or array of device sections are then molded at 2416 to form the package structures 2320. At 2418, lead trimming and forming is performed with package separation and other back-end processing to provide individual packaged electronic device 2300.

Modifications are possible in the described examples, and other implementations are possible, within the scope of the claims.

What is claimed is:
1. An electronic device, comprising:
a multilevel package substrate having a first level, a second level, and a third level;
the first, second, and third levels each having patterned conductive features and molded dielectric features; the first level including a first patterned conductive feature with multiple turns that form a first winding having a first end and a second end; the second level including a second patterned conductive feature; and the third level including a third patterned conductive feature with multiple turns that form a second winding having a first end and a second end;
a die having first, second, and third terminals, the first terminal of the die coupled to the first end of the first winding, the second terminal of the die coupled to the second end of the first winding, and the third terminal of the die coupled to a first conductive lead;
a second die having first, second, and third terminals, the first terminal of the second die coupled to the first end of the second winding, the second terminal of the second die coupled to the second end of the second winding, and the third terminal of the second die coupled to a second conductive lead; and
a package structure that encloses the die, the second die and a portion of the multilevel package substrate.

2. The electronic device of claim 1, comprising a magnetic shield attached to a side of the multilevel package substrate.

3. The electronic device of claim 2, comprising a second magnetic shield attached to another side of the multilevel package substrate.

4. The electronic device of claim 3, wherein:
the die and the second die are attached to the side of the multilevel package substrate;
the third terminal of the die is soldered to the first conductive lead; and
the third terminal of the second die is soldered to the second conductive lead.

5. The electronic device of claim 3, wherein:
the die is attached to a die attach pad;
the second die is attached to the die attach pad or another die attach pad;
the multilevel package substrate is attached to the die attach pad or a further die attach pad; and
the package structure encloses the multilevel package substrate and portions of the conductive leads.

6. The electronic device of claim 1, wherein:
the die and the second die are attached to a side of the multilevel package substrate;
the third terminal of the die is soldered to the first conductive lead; and
the third terminal of the second die is soldered to the second conductive lead.

7. The electronic device of claim 1, wherein:
the die is attached to a die attach pad;
the second die is attached to the die attach pad or another die attach pad;
the multilevel package substrate is attached to the die attach pad or a further die attach pad; and
the package structure encloses the multilevel package substrate and portions of the conductive leads.

8. An electronic device, comprising:
a multilevel package substrate attached to a die attach pad and having a first level, a second level, and a third level; the first, second, and third levels each having patterned conductive features and molded dielectric features; the first level including a first patterned conductive feature with multiple turns that form a first winding having a first end and a second end; the second level including a second patterned conductive feature;
and the third level including a third patterned conductive feature with multiple turns that form a second winding having a first end and a second end;
a die attached to the die attach pad, the die having first, second, and third terminals, the first terminal of the die coupled to the first end of the first winding, the second terminal of the die coupled to the second end of the first winding, and the third terminal of the die coupled to a first conductive lead; and
a package structure that encloses the die and a portion of the multilevel package substrate and portions of the conductive leads.

9. A magnetic assembly, comprising:
a multilevel package substrate having a first level, a second level, and a third level, the first, second, and third levels each having patterned conductive features and molded dielectric features;
the first level including a first patterned conductive feature with multiple turns that form a first winding having a first end and a second end;
the second level including a second patterned conductive feature;
the third level including a third patterned conductive feature with multiple turns that form a second winding having a first end and a second end;
a die attached to a side of the multilevel package substrate, the die having first, second, and third terminals, the first terminal of the die coupled to the first end of the first winding, the second terminal of the die coupled to the second end of the first winding, and the third terminal of the die coupled to a first conductive lead; and
a second die attached to the side of the multilevel package substrate, the second die having first, second, and third terminals, the first terminal of the second die coupled to the first end of the second winding, the second terminal of the second die coupled to the second end of the second winding, and the third terminal of the second die coupled to a second conductive lead.

10. A magnetic assembly, comprising:
a multilevel package substrate having a first level, a second level, and a third level, the first, second, and third levels each having patterned conductive features and molded dielectric features;
the first level including a first patterned conductive feature with multiple turns that form a first winding having a first end and a second end;
the second level including a second patterned conductive feature;
the third level including a third patterned conductive feature with multiple turns that form a second winding having a first end and a second end;
a die attached to a side of the multilevel package substrate, the die having first, second, and third terminals, the first terminal of the die coupled to the first end of the first winding, the second terminal of the die coupled to the second end of the first winding, and the third terminal of the die coupled to a first conductive lead; and
a magnetic shield attached to the side of the multilevel package substrate.

11. The magnetic assembly of claim 10, comprising a second magnetic shield attached to another side of the multilevel package substrate.

12. A method for fabricating an electronic device, the method comprising:
fabricating a multilevel package substrate, including:
forming a first level on a carrier structure, the first level having first molded dielectric features and a first patterned conductive feature with multiple turns that form a first winding,
forming a second level on the first level, the second level having second patterned conductive features and second molded dielectric features,
forming a third level on the second level, the third level having third molded dielectric features and a third patterned conductive feature with multiple turns that form a second winding, and
removing the carrier structure from the first level;
performing an electrical connection process that couples a first die and the first winding in a first circuit, and couples a second die and the second winding in a second circuit isolated from the first circuit; and
performing a molding process that encloses a portion of the multilevel package substrate and the first and second dies in a package structure.

13. The method of claim 12, wherein the electrical connection process includes soldering the first and second dies to a side of the multilevel package substrate.

14. The method of claim 13, further comprising attaching a magnetic shield to the side of the multilevel package substrate.

15. The method of claim 12, further comprising attaching a magnetic shield to a side of the multilevel package substrate.

16. The method of claim 12, further comprising:
attaching the multilevel package substrate to a first die attach pad of a lead frame;
attaching the first die to the first die attach pad; and
attaching the second die to a second die attach pad of the lead frame.

\* \* \* \* \*